United States Patent
Kolze et al.

(10) Patent No.: US 7,952,502 B2
(45) Date of Patent: May 31, 2011

(54) IMBALANCE AND DISTORTION CANCELLATION FOR COMPOSITE ANALOG TO DIGITAL CONVERTER (ADC)

(75) Inventors: Thomas J. Kolze, Phoenix, AZ (US); Bruce J. Currivan, Dove Canyon, CA (US); Ramon Gomez, San Juan Capistrano, CA (US); Loke Tan, Newport Coast, CA (US); Lin He, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/949,752

(22) Filed: Nov. 18, 2010

(65) Prior Publication Data

US 2011/0063148 A1    Mar. 17, 2011

Related U.S. Application Data

(63) Continuation-in-part of application No. 12/453,431, filed on May 11, 2009.

(60) Provisional application No. 61/392,604, filed on Oct. 13, 2010, provisional application No. 61/136,353, filed on Aug. 29, 2008.

(51) Int. Cl.
    *H03M 1/06* (2006.01)
(52) U.S. Cl. ........ 341/118; 341/119; 341/120; 341/139; 341/155; 341/159
(58) Field of Classification Search .......... 341/118–121, 341/139, 155, 159, 173
    See application file for complete search history.

(56) References Cited

U.S. PATENT DOCUMENTS

| | | | | |
|---|---|---|---|---|
| 5,327,458 | A * | 7/1994 | Yamamoto | 375/230 |
| 5,714,956 | A * | 2/1998 | Jahne et al. | 341/155 |
| 6,031,478 | A * | 2/2000 | Oberhammer et al. | 341/155 |
| 6,172,635 | B1 * | 1/2001 | Nakamura et al. | 341/155 |
| 6,271,780 | B1 * | 8/2001 | Gong et al. | 341/139 |
| 6,333,707 | B1 * | 12/2001 | Oberhammer et al. | 341/155 |
| 6,377,196 | B1 * | 4/2002 | Kolsrud et al. | 341/118 |
| 7,030,800 | B2 * | 4/2006 | Arai et al. | 341/155 |
| 7,365,664 | B2 * | 4/2008 | Caduff et al. | 341/139 |
| 7,719,451 | B2 * | 5/2010 | Tamba | 341/120 |
| 7,873,426 | B2 * | 1/2011 | Yamada | 700/94 |
| 2007/0080844 | A1 * | 4/2007 | Terazawa et al. | 341/155 |
| 2010/0052958 | A1 * | 3/2010 | Roeven et al. | 341/139 |

* cited by examiner

*Primary Examiner* — Linh V Nguyen
(74) *Attorney, Agent, or Firm* — Garlick Harrison & Markison; Shayane X. Short

(57) ABSTRACT

Imbalance and distortion cancellation for composite analog to digital converter (ADC). Such an 'ADC' is implemented using two or more ADCs may be employed for sampling (e.g., quantizing, digitizing, etc.) of an analog (e.g., continuous time) signal in accordance with generating a digital (e.g., discrete time) signal. Using at least two ADCs allows for the accommodation and sampling of various signals having a much broader dynamic range without suffering degradation in signal to noise ratio (SNR). Generally, the signal provided via at least one of the paths corresponding to at least one of the respective ADCs is scaled (e.g., attenuated), so that the various ADCs effectively sample signals of different magnitudes. The ADCs may respectively correspond to different magnitude and/or power levels (e.g., high power, lower power, any intermediary power level, etc.). Various implementations of compensation may be performed along the various paths corresponding to the respective ADCs.

26 Claims, 11 Drawing Sheets adaptively calibrate frequency-selective ADC imbalance

3rd order distortion in non-attenuated path

IMBALANCE AND DISTORTION CANCELLATION FOR COMPOSITE ANALOG TO DIGITAL CONVERTER (ADC)

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional patent application which is hereby incorporated herein by reference in its entirety and made part of the present U.S. Utility patent application for all purposes:
1. U.S. Provisional Application Ser. No. 61/392,604, entitled "Imbalance and distortion cancellation for composite analog to digital converter (ADC)," filed Oct. 13, 2010, pending.

CONTINUATION-IN-PART (CIP) PRIORITY CLAIM, 35 U.S.C. §120

The present U.S. Utility patent application also claims priority pursuant to 35 U.S.C. §120, as a continuation-in-part (CIP), to the following U.S. Utility patent application which is hereby incorporated herein by reference in its entirety and made part of the present U.S. Utility patent application for all purposes:
1. U.S. Utility application Ser. No. 12/453,431, entitled "Analog to digital converter (ADC) with extended dynamic input range," filed May 11, 2009, pending, which claims priority pursuant to 35 U.S.C. §119(e) to the following U.S. Provisional Patent Application which is hereby incorporated herein by reference in its entirety and made part of the present U.S. Utility patent application for all purposes:
  a. U.S. Provisional Application Ser. No. 61/136,353, entitled "Analog to digital converter (ADC) with extended dynamic input range," filed Aug. 29, 2008, now expired.

BACKGROUND OF THE INVENTION

1. Technical Field of the Invention

The invention relates generally to communication systems; and, more particularly, it relates to imbalance and distortion cancellation for one or more analog to digital converters (ADCs) as may be implemented within various communication devices.

2. Description of Related Art

Data communication systems have been under continual development for many years. Generally speaking, a data communication system may be viewed as supporting the transmission of any of a variety of types of information (e.g., data, voice, media, etc.) from a first location to a second location within such a communication system. Communication systems are known to support wireless and wire lined communications between wireless and/or wire lined communication devices. Also generally speaking, within the context of communication systems that employ various types of communication devices, there is a first communication device at one end of a communication channel with encoder capability and second communication device at the other end of the communication channel with decoder capability. In many instances, one or both of these two communication devices includes encoder and decoder capability (e.g., within a bi-directional communication system). Transferring information from one location to another can be applied generally within any type of communication system, including those that employ some form of data storage (e.g., hard disk drive (HDD) applications and other memory storage devices) in which data is processed and/or encoded before writing to the storage media, and then the data is processed and/or decoded after being read/retrieved from the storage media.

Certain communication systems employ one or more of various types of coding (e.g., error correction codes (ECCs) whose decoding may be performed iteratively) to ensure that the data extracted from a signal received at one location of a communication channel is the same information that was originally transmitted from another location of the communication channel. Communications systems with iterative codes are often able to achieve lower bit error rates (BER) than alternative codes for a given signal to noise ratio (SNR).

In addition, any of a variety of types of communication systems may employ one or more of various types of signaling (e.g., orthogonal frequency division multiplexing (OFDM), code division multiple access (CDMA), synchronous code division multiple access (S-CDMA), time division multiple access (TDMA), etc.) to allow more than one user access to the communication system. Such signaling schemes may generally be referred to as multiple access signaling schemes.

In accordance with processing signals transmitted across a communication channel within such communication systems, one function that is oftentimes performed when receiving a signal is to perform digital sampling thereof (e.g., using an analog to digital converter (ADC)). When dealing with signals that may temporally vary across a relatively large dynamic range, performing such digital sampling can be problematic and incur certain deleterious effects such as undesirably large signal to noise ratios (SNRs). The prior art does not adequately provide for means to address and overcome these and other deficiencies.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

The imbalance and distortion cancellation, in accordance with the various principles and aspects presented herein, may be performed for use by one or more analog to digital converters (ADCs) within any of a variety of communication systems and/or applications. Such imbalance and distortion cancellation techniques, architectures, and/or approaches presented herein can be employed within a wide variety of communication systems, some types of which are described below.

Figure 1:
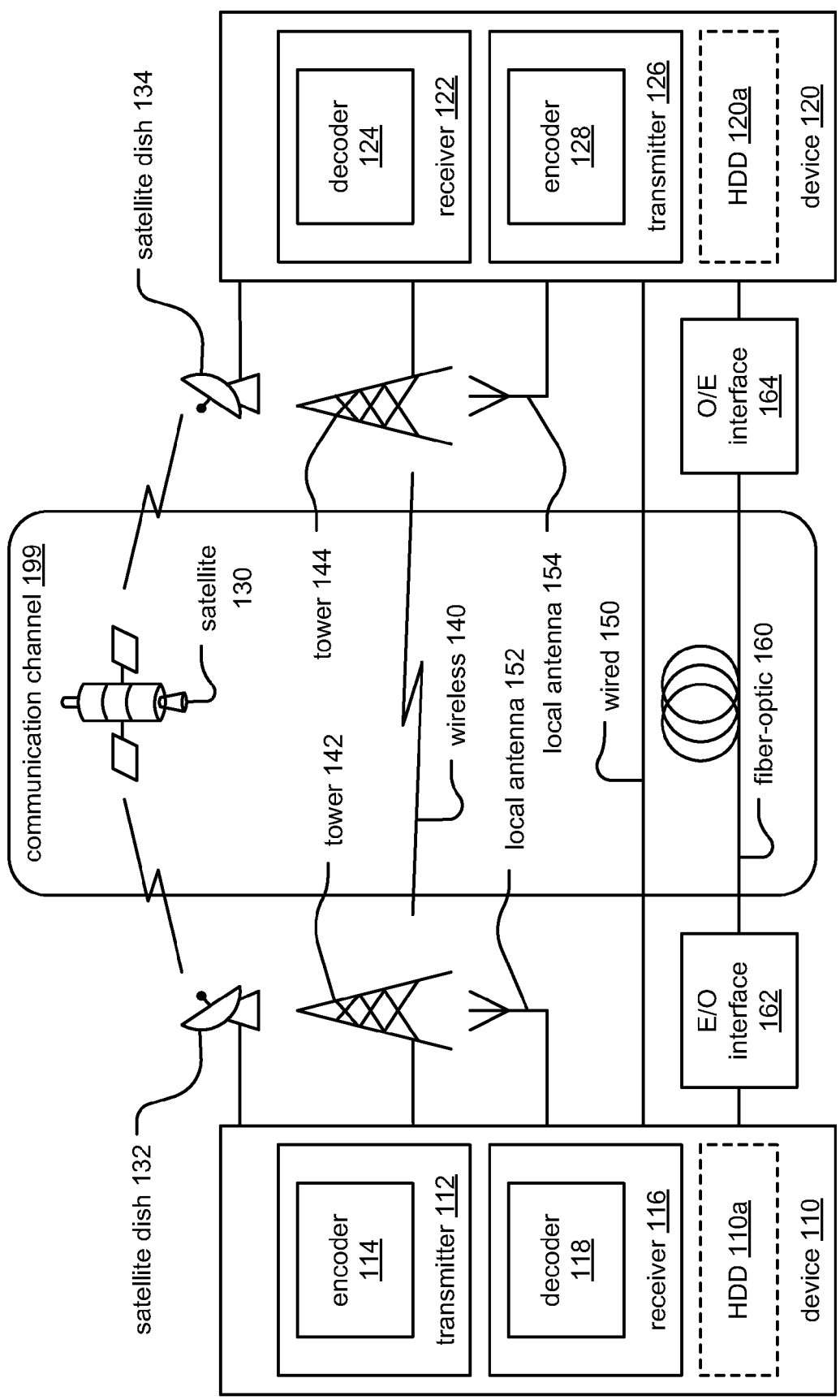
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
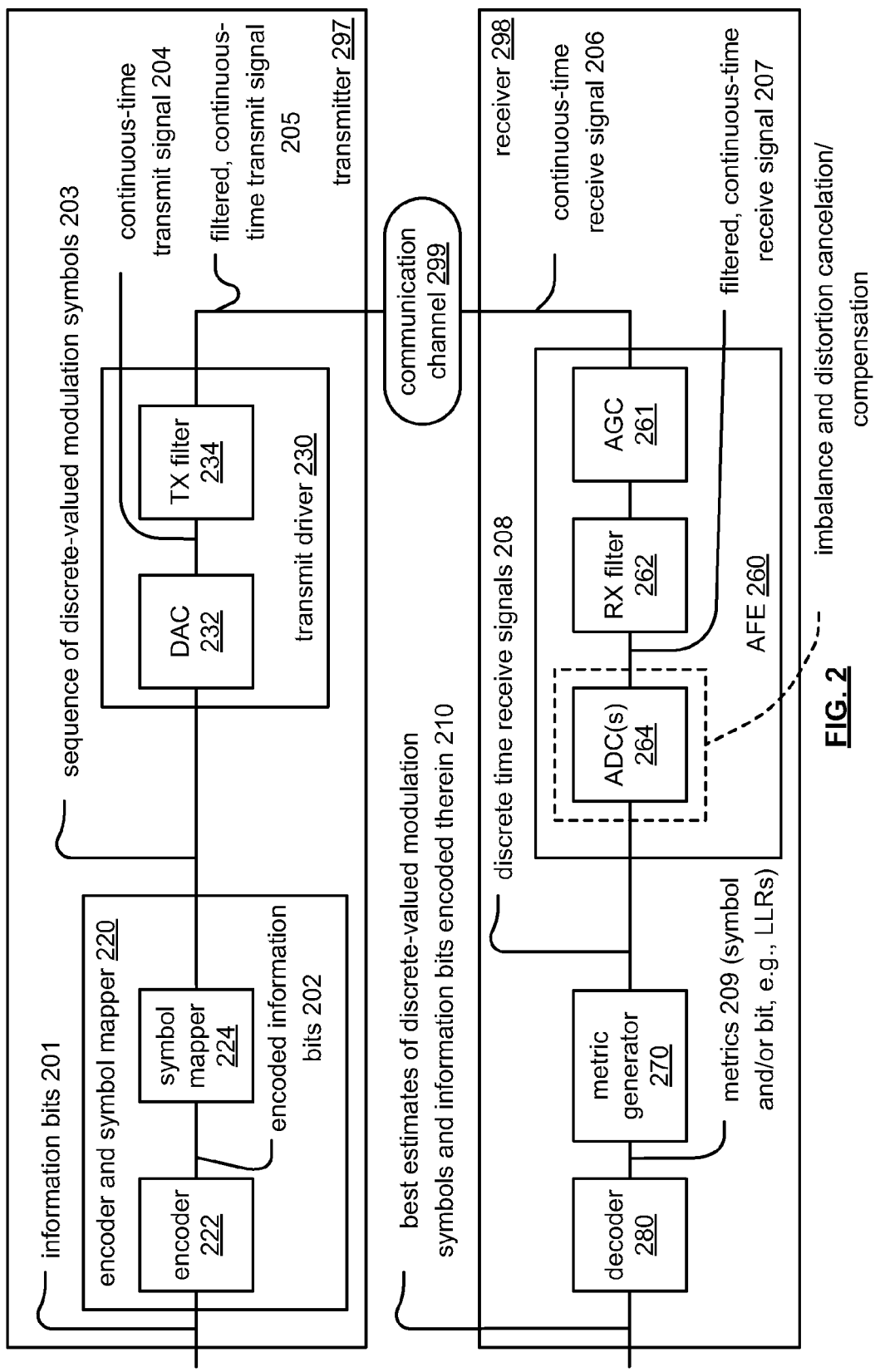

FIG. 1 and FIG. 2 are diagrams illustrate various embodiments of communication systems, respectively. Referring to FIG. 1, this embodiment of a communication system is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Either one of both of the communication device 110 and the communication device 120 can include a hard disk drive (HDD) (or be coupled to a HDD). For example, the communication device 110 can include a HDD 110a, and the communication device 120 can include a HDD 120a.

In some instances, to reduce transmission errors that may undesirably be incurred within a communication system, error correction and channel coding schemes are often employed. Generally, these error correction and channel coding schemes involve the use of an encoder at the transmitter and a decoder at the receiver. Clearly, a given communication device may include both en encoder and a decoder to effectuate bi-directional communication with one or more other communication devices; in other embodiments, a given communication device includes only encoding functionality (e.g., a transmitter type communication device) or only decoding functionality (e.g., a receiver type communication device).

Any of the various types of imbalance and distortion cancellation described herein, and their equivalents, can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit (TX) filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes an automatic gain control (AGC) circuit or module 261, a receive (RX) filter 262 (that generates a filtered, continuous-time receive signal 207) and one or more ADCs (Analog to Digital Converters) 264 (that generates discrete-time receive signals 208). The ADC(s) 264 may be viewed as incorporating imbalance and distortion cancellation/compensation functionality in accordance with the principles and/or aspects of the invention presented herein; such functionality may be directed to embodiments including two or more ADCs. Greater details are provided herein regarding various means by which such imbalance and distortion cancellation may be effectuated. A metric generator 270 calculates metrics 209 (e.g., on either a symbol and/or bit basis) that are employed by a decoder 280 to make best estimates of the discrete-valued modulation symbols and information bits encoded therein 210. The decoder 280 may be a forward error correction (FEC) decoder employing any of a variety of error correction codes (ECCs).

As the reader will understand, various aspects and principles of the invention are operative to mitigate the effects of ADC clipping. Clipping events may cause deleterious events such as impulsive noise in a communication system, which may result in an inability of the decoder 280 to correct all errors (e.g., uncorrected errors may be included in the best estimates output from the decoder 280). By mitigating or softening such clipping effects, the decoder 280 is able to correct more (if not all) errors thereby reducing the number of uncorrected errors. Also, various aspects and principles of the invention directed and related to mitigating the effects of ADC clipping may be operative to relax accuracy requirements of the AGC circuit or module 261.

The processing of received signals of either of the previous embodiments may be implemented to include various aspects and/or embodiment of the invention therein (e.g., any such embodiment that includes digital sampling of a signal, such as by one or more ADCs, and that include such functionality directed to imbalance and distortion cancellation therefore). In addition, several of the following Figures describe other and particular embodiments (some in more detail) that may be used to support the devices, systems, functionality and/or methods that may be implemented in accordance with certain aspects and/or embodiments of the invention.

Figure 3:
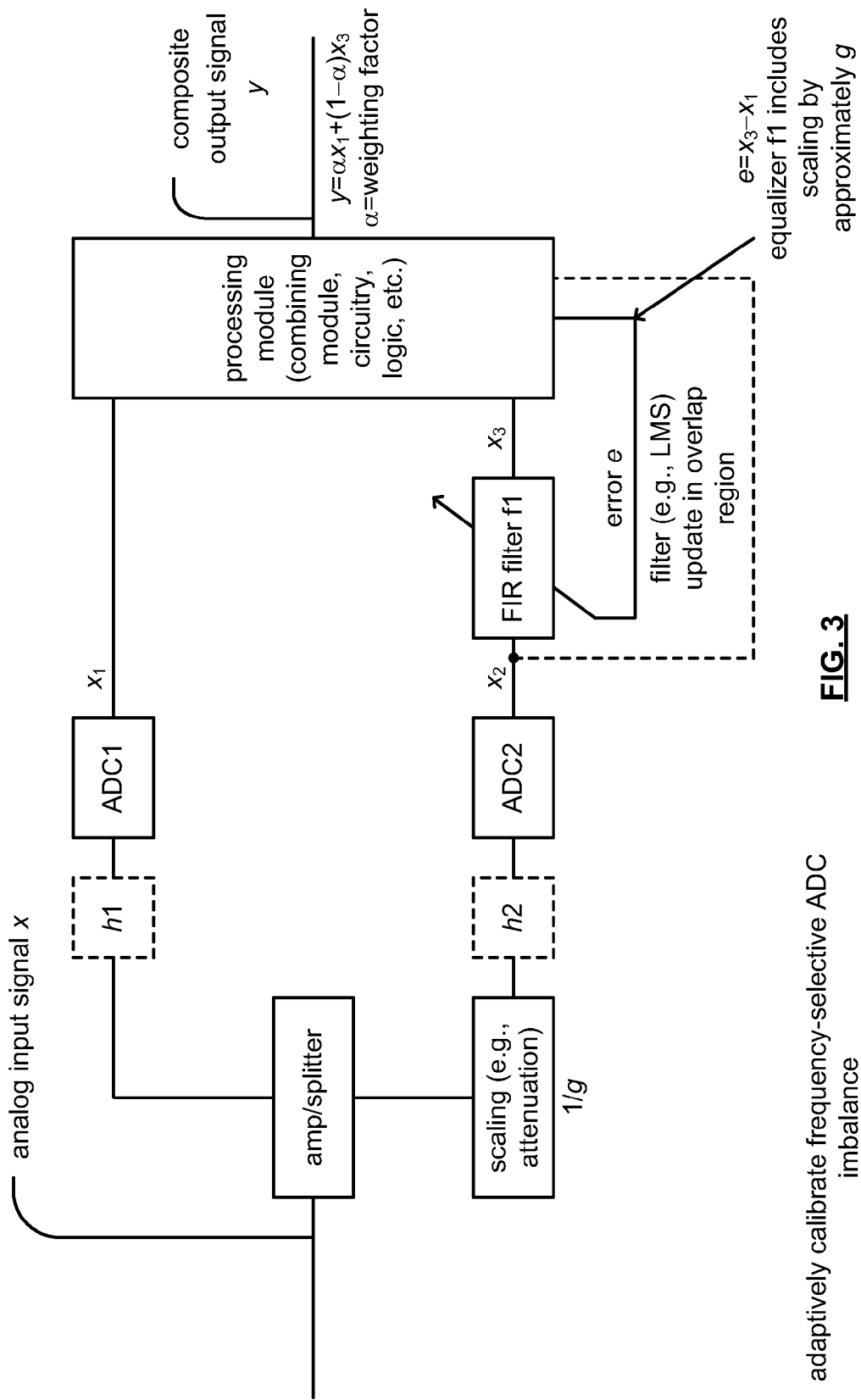
FIG. 3 illustrates an embodiment operative for adaptively calibrating frequency-selective imbalance between at least two analog to digital converters (ADCs) implemented for processing an analog signal.

FIG. 3 illustrates an embodiment operative for adaptively calibrating frequency-selective imbalance between at least two analog to digital converters (ADCs) implemented for processing an analog signal. This embodiment, as well as other embodiments, may be extended to include more than two ADCs. This diagram shows an embodiment by which any frequency selective gain difference between various ADCs (as in a composite ADC including two or more ADCs) within such a device may be calibrated out.

Generally, the various individual ADCs within such a composite ADC may be referred to as sub-ADCs. As may be seen, a continuous time or analog input signal x is received by an amplifier/splitter that is operative to provide that continuous time or analog input signal x via more than one pathway along which respective sampling is performed (e.g., using respective ADCs within the respective pathways). This embodiment show two pathways (each including a respective ADC therein) extending from the amplifier/splitter, but it is of course noted that additional pathways may be included without departing from the scope and spirit of the invention (e.g., generally, N pathways as achieved using a 1:N amplifier/splitter or more than one amplifier/splitter).

Along one or more of the pathways (e.g., the bottom pathway in this embodiment), a scaling module is operative to modify the magnitude of the continuous time or analog input signal x. In certain embodiments, this scaling module performs attenuation of the continuous time or analog input signal x. In other embodiments, a scaling module may instead perform amplification of the continuous time or analog input signal x in the upper path (ADC1), which is functionally equivalent to performing attenuation in the other path (ADC2), but with different implementation considerations. Of course, a combination of amplification along a first pathway and attenuation along a second pathway may be performed. As the reader will understand, the net result of such differential scaling along the respective pathways applies different gains to the continuous time or analog input signal x thereby generating the two respective, scaled signals that respectively provided as inputs to ADC1 and ADC2.

In this particular embodiment, a higher net gain is provided ahead of ADC1, causing the ADC1 to clip during sampling at a relatively lower value of the continuous time or analog input signal x than ADC2. If, in a particular embodiment, amplification is alternatively employed ahead of ADC1 instead of attenuation being employed ahead of ADC2, an additional clipping circuit may be provided ahead of ADC1 to limit the dynamic range of the continuous time or analog input signal x to values appropriate for the implementation, that is, to protect the input of ADC1. In this case, the processing modules, circuits, and/or functional blocks which follow will be provided with a signal or other information indicating when the additional clipping has occurred, so that the clipping may be taken into account in the processing of the ADC samples output there from. In many of the embodiments employed herein, attenuation is employed ahead of ADC2, though it is of course understood that any alternative variations and/or combinations of amplification and/or attenuation may be employed along the respective pathways without departing from the scope and spirit of the invention.

By scaling the continuous time or analog input signal x downward (e.g., attenuation), a smaller range of signals provided via the bottom pathway allows for a sampling of the continuous time or analog input signal x by one ADC in instances when the other of the ADCs may undergo clipping in the event of a very large signal (e.g., signal having a very large dynamic range). As mentioned above, this clipping may occur in a given ADC itself, or a clipping circuit may be inserted before a respective ADC to protect that ADC from overrange.

Each of the pathways may include a respective filter module, shown as h1 and h2, corresponding to frequency selective effects inherent in each of the two ADCs (e.g., ADC1 and ADC2). Compensation of the difference there between (e.g., difference between h1 and h2) is performed to make the response through each of the two ADCs (e.g., ADC1 and ADC2) as close to identical as possible. Such compensation may be performed in accordance with any of the various embodiments and/or principles presented herein or their equivalents (e.g., adaptive non-linearity compensation, finite impulse response (FIR) filtering or equalization, etc.).

Thereafter, along each respective pathway, a respective ADC is operative to perform sampling of the continuous time or analog input signal x or the scaled version thereof (e.g., after having passed through the scaling module). In this embodiment, the digital signal output from the top ADC1 is shown as $x_1$ (which is then passed to a processing module), and the digital signal output from the bottom ADC2 is shown as $x_2$.

Thereafter, each respective signal output from the ADC1 and ADC2 may then be passed through a respective filter (equalizer) to adjust its response. Again, that is to say, compensation of the difference there between (e.g., difference between h1 and h2) is performed to make the response through each of the two ADCs (e.g., ADC1 and ADC2) as close to identical as possible. This particular embodiment is related to performing filtering or equalization to the digital signal along one of the respective paths (e.g., output from the bottom ADC2, shown as $x_2$). After the signal, $x_2$, passes through a short finite impulse response (FIR) filter f1 (equalizer), a signal $x_3$ is also then passed to the processing module. In one possible embodiment, the filter f1 (equalizer) may consist of a single tap (e.g., such as in accordance with performing scalar multiplication). In an alternative embodiment, the filter f1 (equalizer) may consist of more than one tap (e.g., such as in accordance with a tapped delay line). In yet another embodiment, the filter f1 (equalizer) may include an infinite impulse response (IIR) filter. The processing module is operative to combine the two signals, $x_1$ and $x_3$, input thereto and to combine them to form a composite signal y. The composite signal y may be viewed as being a weighted combination of the two signals, $x_1$ and $x_3$, using a weighting factor, $\alpha$, as follows:

$$y = \alpha x_1 + (1-\alpha) x_3$$

The processing module is also operative to analyze and process the two signals, $x_1$ and $x_3$, input thereto in accordance with a least means square (LMS) methodology to drive any error between the two ADCs (ADC1 and ADC2) to zero (ideally), by adapting the short FIR equalizer implemented after ADC2. The FIR filter f1 (equalizer) may also be adapted at a highly sub-sampled rate and can perhaps use a sign-LMS approach as well without departing from the scope and spirit of the invention.

In other embodiments, different means may be used to adapt the equalizer. For example, in certain embodiments, when the received signal does not have the expected or appropriate characteristics, that signal may be replaced by a calibration signal which is used to measure the respective responses of the two ADCs. Such a calibration signal may consist of a swept or stepped-frequency sine wave, a chirp signal, a pseudo-noise (PN) signal, or any other desired signal, etc. In one embodiment, the LMS methodology is used to adjust the equalizer. Such an embodiment allows for calibration of the ADC response to proceed while signals are being received (e.g., without interruption of signal reception such as may be effectuated in certain embodiments).

Also, in certain embodiments, operations may provide additional refinement of any undesirably clipped samples that may come out of the bottom ADC (ADC2) and pass through the FIR filter f1 (equalizer), and in other certain embodiments, such adaptations in accordance with the principles described herein or their equivalents are disabled until the effects of such clipped samples at the output of the finite impulse response (FIR) filter f1 have ceased or become negligible. Further, additional refinement may be performed on any undesirably clipped samples that may come out of the upper ADC (ADC1) as it is used to generate the error signal to train the FIR filter f1 (equalizer). As an example, a clipped value from ADC1 may be replaced with a scaled value of a corresponding sample from ADC2 (e.g., when that corresponding sample from ADC2 is not clipped). As a second example, an error sample resulting from a clipped value from ADC1 may be replaced with zero, which is equivalent to gating the LMS methodology so as to not update the equalizer taps when ADC1 clips.

Generally speaking, at each sample, a respective value of $\alpha$ may be selected based on the value of the signal, $x_1$, output from the top ADC (ADC1) (also as shown with respect to FIG. 5 generally as combining two signals $z_1$ and $z_2$):

Region 1: When in overlap region (both ADC1 and ADC2 not clipped), use $\alpha$=initial combining value (e.g., based on estimated relative ADC SNR of the two signals, $x_1$ and $x_3$, and an assumption of independent errors in the two paths [whether actually independent or not] and then combining the two signals, $x_1$ and $x_3$, to maximize the SNR of the resultant combined signal under these assumptions).

Region 2: When ADC2 is in a small amplitude region (relative to ADC1), ADC2 may not give a reliable sample, so weight ADC1 more heavily (e.g., $\alpha$ is set closer to 1 than it is in Region 1). Region 2 may also apply when ADC2 is in a region of excessive nonlinearity (e.g., due to differential non-linearity (DNL) of its quantizer). Region 2 may also apply when the input to ADC2 is only slightly above the input amplitude corresponding to the least significant bit of ADC2.

Region 3: In one embodiment, when ADC1 is clipping, totally ignore ADC1 by setting $\alpha$=0. In an alternative embodiment, when ADC1 is clipping, the value of $\alpha$ may be set to a relatively very small value, such that the relative contribution and effect of ADC1 are reduced by a desired amount relative to the contribution and effect of ADC2.

At edges between these various regions, and when transitioning between regions, the value of $\alpha$ may be blended or modified sufficiently slowly (near or at those transition regions), so that a sudden change of the weighting coefficient, $\alpha$, does not incur any reduction in performance or other deleterious effects.

Figure 4:
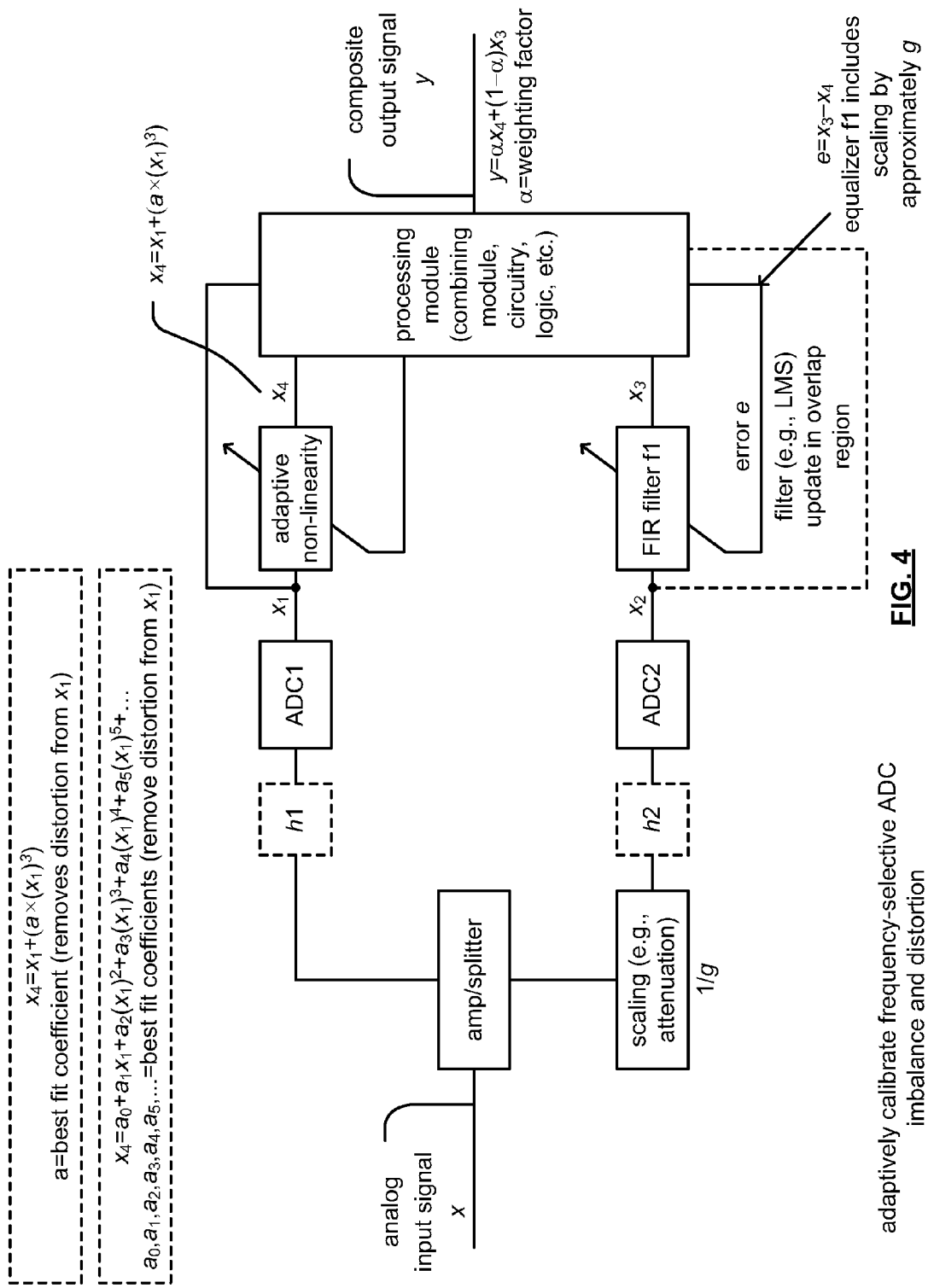
FIG. 4 illustrates an embodiment operative for adaptively calibrating frequency-selective imbalance and distortion between at least two ADCs implemented for processing an analog signal.

FIG. 4 illustrates an embodiment operative for adaptively calibrating frequency-selective imbalance and distortion between at least two ADCs implemented for processing an analog signal. This embodiment, as well as other embodiments, may be extended to include more than two ADCs.

This and other embodiments have some similarities with the previous embodiment of FIG. 3, with at least one difference being that the top pathway perform compensation for any non-linearity that may exist within the signal, $x_1$, that is output from the top ADC1. An adaptive non-linearity module processes the signal, $x_1$, that is output from the top ADC1 thereby generating the signal, $x_4$.

The adaptive non-linearity module and a FIR filter f1 (equalizer) are operative to calibrate or correct for distortion. One of the deficiencies addressed is that the top ADC1 (e.g., the one with less attenuation of the signal that it receives and samples) may be expected to exhibit some degree of compression, since it is exposed to a larger signal than the bottom ADC2 at the overlap/handover region where the two ADCs are being "spliced" together.

This compression may cause an error or discontinuity at the splicing or handover point between the two ADCs. By using certain of the novel principles and aspects of the invention presented herein, this compression characteristic may be estimated and corrected. In the simplest case, the compression will be modeled as a linear term plus a $3^{rd}$ order distortion, that is, $x_4=x_1+\alpha x_1^3$, where $x_1$ is the input signal to the adaptive non-linearity module, and the signal $x_4$ is the output signal from the adaptive non-linearity module. The coefficient, $\alpha$, is a small (normally negative) coefficient to be estimated. In more complex models including additional terms (e.g., squared and higher order terms), the signal, $x_4$, output from the adaptive non-linearity module may be characterized as follows:

$$x_4=\alpha_0+\alpha_1 x_1+\alpha_2 x_1^2+\alpha_3 x_1^3+\alpha_4 x_1^4+\alpha_5 x_1^5+\ldots$$

The estimation of the coefficient $\alpha$ may proceed as follows:

The processing module (e.g., combining logic) is operative to examine the input signals, $x_1$ and $x_2$ (alternatively, $x_1$ and $x_3$, may also be used) in the overlap region, that is, samples for which neither ADC1 nor ADC2 is clipped, and for which samples of both ADCs are simultaneously available. In accordance with this analysis, it may be assumed that the top ADC1, having lesser input attenuation than the bottom ADC2, will be more likely to exhibit compression in the overlap region, since it is exposed to a larger signal than ADC2, which benefits from the larger input attenuation. Hence, the bottom ADC2 may be employed as a reference to remove any deleterious compression effects from the top ADC1. This may be done by collecting samples of both ADC1 and ADC2, $x_1$ and $x_2$ respectively, and performing a linear regression to determine the coefficient $\alpha$ that best fits a $3^{rd}$ order term mapping from $x_1$ to $x_2$. Another approach is to use the LMS methodology adaptively to estimate the coefficient $\alpha$ that best fits a $3^{rd}$ order term mapping from $x_1$ to $x_2$, as described herein.

Once the best-fit coefficient $\alpha$ has been estimated, it may provided to and employed by the adaptive non-linearity module, that is operative to remove the deleterious distortion from the signal, $x_1$, thereby generating the signal, $x_4$.

Figure 5:
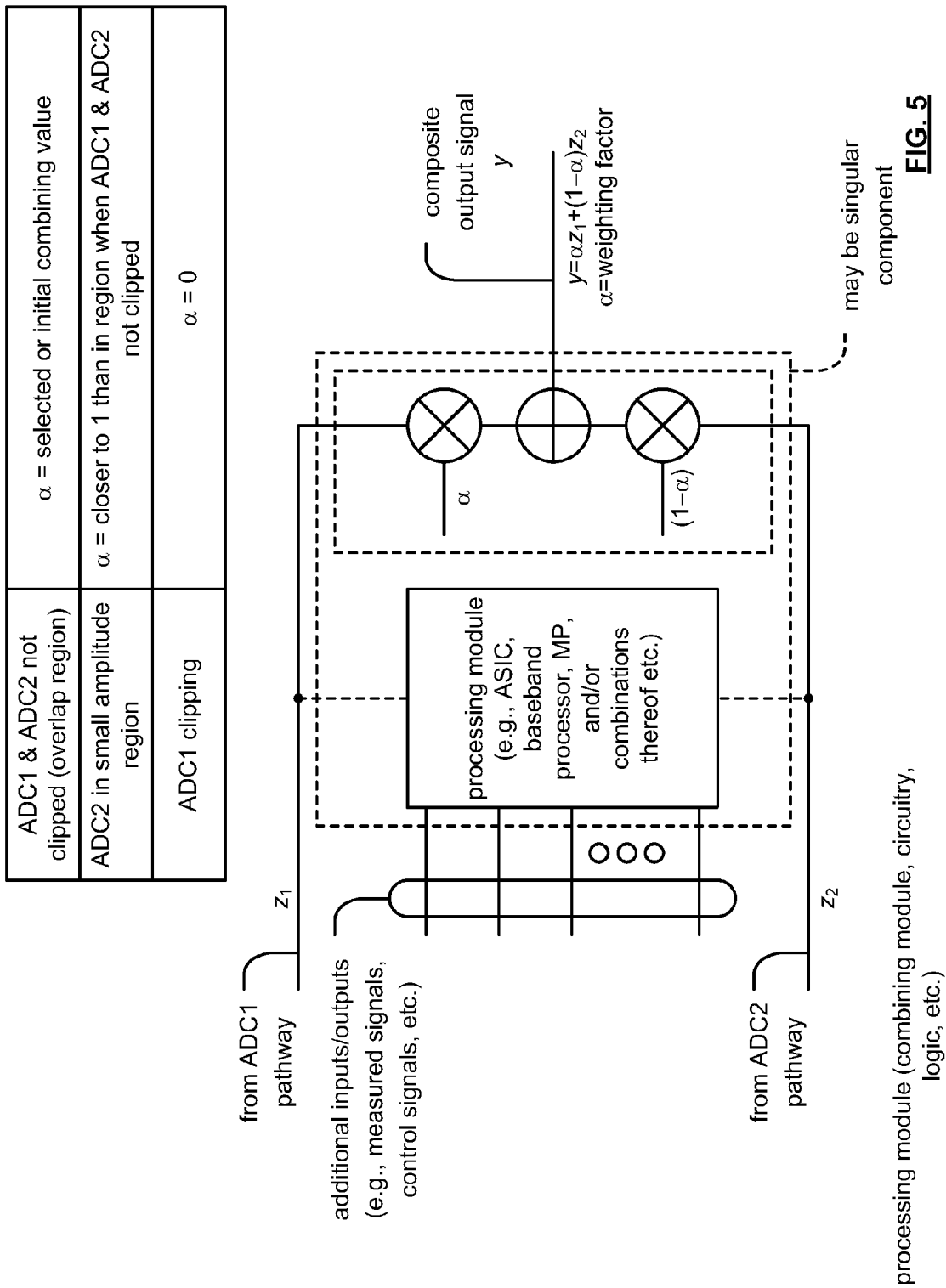
FIG. 5 illustrates an embodiment operative for combining signals received via at least two respective signal paths corresponding respectively to at least two ADCs.

FIG. 5 illustrates an embodiment operative for combining signals received via at least two respective signal paths corresponding respectively to at least two ADCs.

Appropriately implemented multipliers and a summer are operative to generate a composite signal y that may be viewed as being a weighted combination of the two signals, $z_1$ and $z_2$, using a weighting factor, $\alpha$, as follows:

$$y=\alpha z_1+(1-\alpha)z_2$$

These signals, $z_1$ and $z_2$, may correspond to different signals depending on the embodiment of interest. For example, the signals, $z_1$ and $z_2$, may correspond to signals, $x_1$ and $x_2$, respective, in FIG. 3. Alternatively, the signals, $z_1$ and $z_2$, may correspond to signals, $x_4$ and $x_2$, respective, in FIG. 4 or other diagrams herein. Generally speaking, the functionality of this diagram may be employed to perform the combining of any two such signals. When combining more than two signals (e.g., in an embodiment that includes three or more ADCs and reps pathways), more than one instantiation of such combining functionality can be employed (e.g., first combining functionality may be employed to combine first and second signals, $z_1$ and $z_2$, thereby generating a first composite signal, $y_1$; then second combining functionality may be employed to combine signals, $y_1$ and a third signal $z_3$, thereby generating a second composite signal, $y_2$; and so on). Of course, other means by which more than two signals may be combined in accordance with weighting functionality may be employed without departing from the scope and spirit of the invention.

A processing module is also operative to receive any number of input signals (e.g., which may include two signals, $z_1$ and $z_2$) and to generate any number of output signals. For example, the processing module may be implemented to perform calculation of a best-fit coefficient $\alpha$, or a number of best-fit coefficients, $\alpha_0$, $\alpha_1$, $\alpha_2$, $\alpha_3$, etc. in an embodiment that employs additional terms (e.g., squared and higher order terms) when operating in accordance with an adaptive non-linearity module (such as with reference to FIG. 4 or other embodiments).

In addition to, or in an alternative embodiment, the processing module may be implemented to perform processing in accordance with an LMS methodology to drive any error between the two ADCs (e.g., a top ADC1 and a bottom ADC2) to zero (ideally), by adapting the short FIR equalizer implemented after the bottom ADC2 (such as with reference to FIG. 3, FIG. 4 or other embodiments).

Within this embodiment, and other embodiments herein including following embodiments, the functionality or module(s) employed to perform the combining operations in accordance with generating a composite output signal from two signals, $z_1$ and $z_2$, and the processing module that is operative to process any of a number of input signals and/or process/calculate any of a number of output signals and/or parameters may be implemented within a singular component if desired in certain embodiments.

Figure 6:
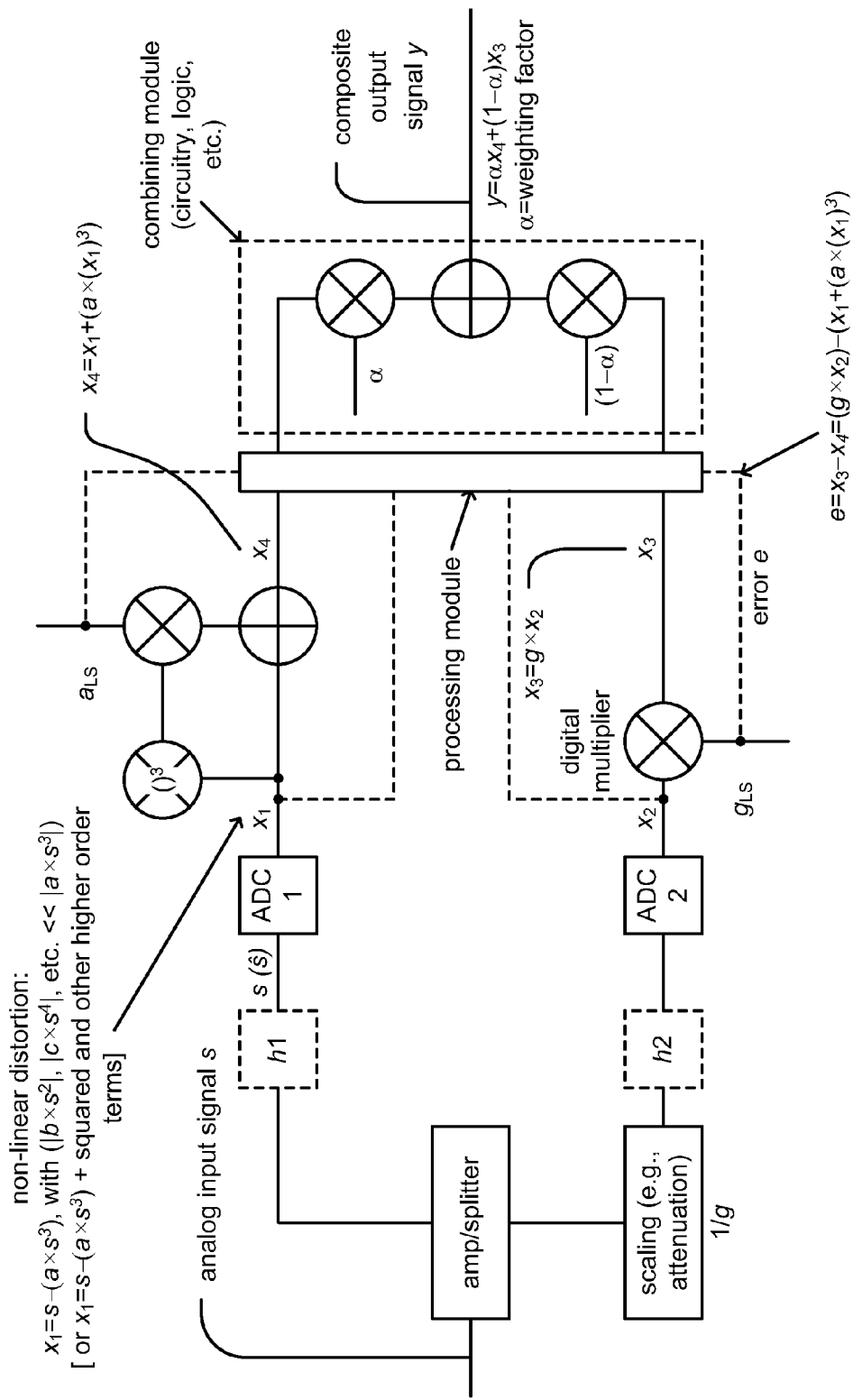
FIG. 6 illustrates an embodiment operative for adaptively calibrating frequency-selective imbalance and distortion between at least two ADCs implemented for processing an analog signal, and particularly for compensating for third order distortion in a non-attenuated path.

FIG. 6 illustrates an embodiment operative for adaptively calibrating frequency-selective imbalance and distortion between at least two ADCs implemented for processing an analog signal, and particularly for compensating for third order distortion in a non-attenuated path. As with other embodiments, this embodiment illustrates functionality for adaptively calibrating frequency-selective imbalance and distortion between at least two ADCs implemented for processing an analog signal, and particularly for compensating for third order distortion in a non-attenuated path.

This and various other embodiments herein (including following embodiments) provide for compensation of 3rd order distortion existing in signals input to the top ADC1 or within a signal input to (i.e., before) the top ADC1 (e.g., using the reference as with respect to the other diagrams in which the top pathway including the ADC1 as including less attenuation of the signal that it receives and samples as compared to the bottom pathway including the ADC2).

Initially, the solution for the simplified case is derived where the FIR filter f1 (equalizer) is not necessarily required. In other words, the frequency response differences between the pathways including the top ADC1 and the bottom ADC2, respectively, are considered negligible. This approach is taken with respect to this initial derivation and analysis for assistance in illustration to the reader; it is of course noted that this is not a necessary assumption for all embodiments, and certain embodiments may certainly include an FIR filter f1 (equalizer) (or other processing module within the bottom pathway) without departing from the scope and spirit of the invention.

It is assumed that, within the continuous time or analog input signal s, the dominant nonlinear distortion (besides the quantization and clipping normally associated with the ADCs) is of the form $x_1 = s - as^3$, where $\alpha$ is typically positive and the term, $as^3$, is small compared to s (i.e., $as^2 \ll 1$) for largest absolute values of s where the ADC1 is not clipping, and higher orders of distortion, and squared distortion, are assumed negligible (again, such assumptions being employed for assistance in illustration to the reader, and not being necessary assumptions for all embodiments).

Next, considering a compensation circuit processing ADC1 that outputs signal, $x_1$, then an appropriately non-linearity adapted signal, $x_4$, generated there from may have the form as follows:

$$x_4 = x_1 + \alpha_{LS} x_1^3,$$

where $\alpha_{LS}$ is a coefficient to be determined to provide for optimal compensation of the non-linear distortion introduced into $x_1$, such as within a non-linearity module. The coefficient, $\alpha_{LS}$, may be calculated by a processing module using a least squares (LS) or LMS methodology as desired in certain embodiments.

It will nonetheless be necessary to match or compensate for any gain differences between the two ADCs, namely, the top ADC1 in the top pathway and the bottom ADC2 in the bottom pathway, which may be accomplished by forming:

$$x_3 = g_{LS} x_2,$$

as described earlier. As mentioned elsewhere herein, when frequency response differences exist between the top ADC1 in the top pathway and the bottom ADC2 in the bottom pathway, then an FIR filter f1 (equalizer) may be employed, and such a FIR filter f1 (equalizer) may absorb the gain compensation, $g_{LS}$, automatically in the solution/implementation.

It is therefore desirable to minimize the squared error in $e = x_3 - x_4$. In other embodiments, weighted squared error solutions may be employed, and they may provide other and/or additional benefits.

Therefore, the error term may be expressed as follows:

$$e = x_3 - x_4 = g_{LS} x_2 - (x_1 + \alpha_{LS} x_1^3),$$

and it is desired that $e=0$, of course, when the input signal is in the overlap region as described above (e.g., when neither [in a 2 ADC embodiment], or none [in a 3 or more ADC embodiment], of the ADCs are clipped).

Forming the following relationship between the gain compensation, $g_{LS}$, the coefficient employed for non-linear distortion, $\alpha_{LS}$ (such as by a non-linearity module), and the digital signals output from the two ADCs (signal, $x_1$, output from ADC1, and signal, $x_2$, output from ADC2) in accordance with driving the error term, e, to zero as follows:

$$g_{LS} x_2 - (x_1 + \alpha_{LS} x_1^3) = 0$$

and solving for the coefficients $g_{LS}$ and $\alpha_{LS}$ with a multitude of inputs corresponding to the digital signals output from the two ADCs, $x_1$ and $x_2$, with the criterion of minimizing the error power, then various means of solving this relationship may be performed including using a least squares (LS) "fitting" methodology indicated as follows:

$$g_{LS}x_2-(x_1+\alpha_{LS}x_1^3)\stackrel{LS}{=}0.$$

In this embodiment, the notation "$\stackrel{LS}{=}$" indicates "solving for 'equality' in the Least Squares (LS) sense."

This Least Squares equation can be written in the matrix form, where [ ]T indicates "transpose" making a row vector to be a column vector:

$$[x_2\text{-}x_1\text{-}x_1^3][(g_{LS}1\ \alpha_{LS})]^{T\stackrel{LS}{=}}0,$$

or, alternatively, $$[x_2\text{-}x_1^3][(g_{LS}\alpha_{LS})]^{T\stackrel{LS}{=}}[x_1].$$

This equation shown above is for one sample respectively from each of the digital signals output from the two ADCs, $x_1$ and $x_2$, but for solution of the coefficients in the "least squares sense", many samples are available and $x_1$ and $x_2$ are in fact column vectors representing many samples, where each pair of samples $x_{1i}$, and $x_{2i}$ for i=1 to N, for N samples from the signals output from the ADC1 and ADC2 of the signals in the overlap region, forms a row of the equation above.

Of course, other variations of this expression may be employed without departing from the scope and spirit of the invention.

As the reader may now understand, a solution for $Ax\stackrel{LS}{=}b$ may be given as follows:

$$x_{LS}=[A^TA]^{-1}A^Tb,$$

where x and b are column vectors in this formulation.

When addressing this embodiment, the solution for the coefficients becomes as follows:

$$[g_{LS}\ a_{LS}]^T=[A^T\ A]^{-1}A^Tb,$$

where $$[A^TA]=\begin{vmatrix} \sum x_{2i}^2 & -\sum x_{2i}x_{1i}^3 \\ -\sum x_{2i}x_{1i}^3 & \sum x_{1i}^6 \end{vmatrix}, \text{ and}$$

$$A^Tb=\begin{vmatrix} \sum x_{2i}x_{1i} \\ -\sum x_{1i}^4 \end{vmatrix}.$$

These equations above show that a least squares solution for the coefficients which balance the gains of the ADCs (e.g., balance the gain of ADC2 with that of ADC1), and at the same time compensate for the non-linear distortion (compression) of one of the ADCs (e.g., ADC1), can be readily computed from a batch of samples.

As the reader may now understand, it has been shown that an LMS methodology can be used to converge the gain compensation, $g_{LS}$, as well as to calculate the various filter coefficients for compensating for frequency response differences between the two ADCs' respective paths. Similarly, the LMS methodology can be used to converge the coefficient employed for non-linear distortion, $\alpha_{LS}$, where the adaptation methodology for the coefficient uses as its feedback error signal −e, where e is the feedback error signal for adapting the FIR filter f1 (equalizer) or $g_{LS}$, and the "signal" for the adaptation updates is then $x_1^3$.

Variations include using $x_1$ as the "signal" in the adaptation, using different update or adaptation scaling coefficients to achieve different adaptation rates for $\alpha_{LS}$ and $g_{LS}$, or the FIR filter f1 (equalizer) coefficients in the more general case, and to separate the gain coefficient from the FIR filter f1 (equalizer) coefficients (and use different adaptation rates), normalizing the filter coefficients to unity sum (or unity power in another variation). Of course, other variations and their equivalents may be employed thereby offering such functionality and operations using different signal(s) and hardware characteristic(s) without departing from the scope and spirit of the invention.

Referring again to the embodiment of FIG. 6, non-linear distortion is compensated using a cubic multiplier, a multiplier whose scaling factor/coefficient is governed by a LS determined coefficient ($\alpha_{LS}$ as employed and described above), as determined using a LS methodology such as may be calculated by a processing module, and an adder. Again, in this diagram, the continuous time or analog input signal s is shown as being provided to the various pathways for digital sampling using respective ADCs. The non-linear distortion in this embodiment may be characterized as follows:

$$x_1=s-\alpha s^3.$$

Again, more complex models may of course include additional terms (e.g., squared and higher order terms) with respect to modeling the non-linear distortion therein.

A digital multiplier is employed in the bottom pathway, after the ADC2, for performing gain compensation, whose scaling factor/coefficient is governed by a LS determined coefficient ($g_{LS}$ as employed and described above), as determined using a LS methodology such as may be calculated by the processing module.

After undergoing appropriate combining such as within a combining module, a composite signal, y, is output without having distortion and imbalance corresponding to or associated with the two ADCs.

Figure 7:
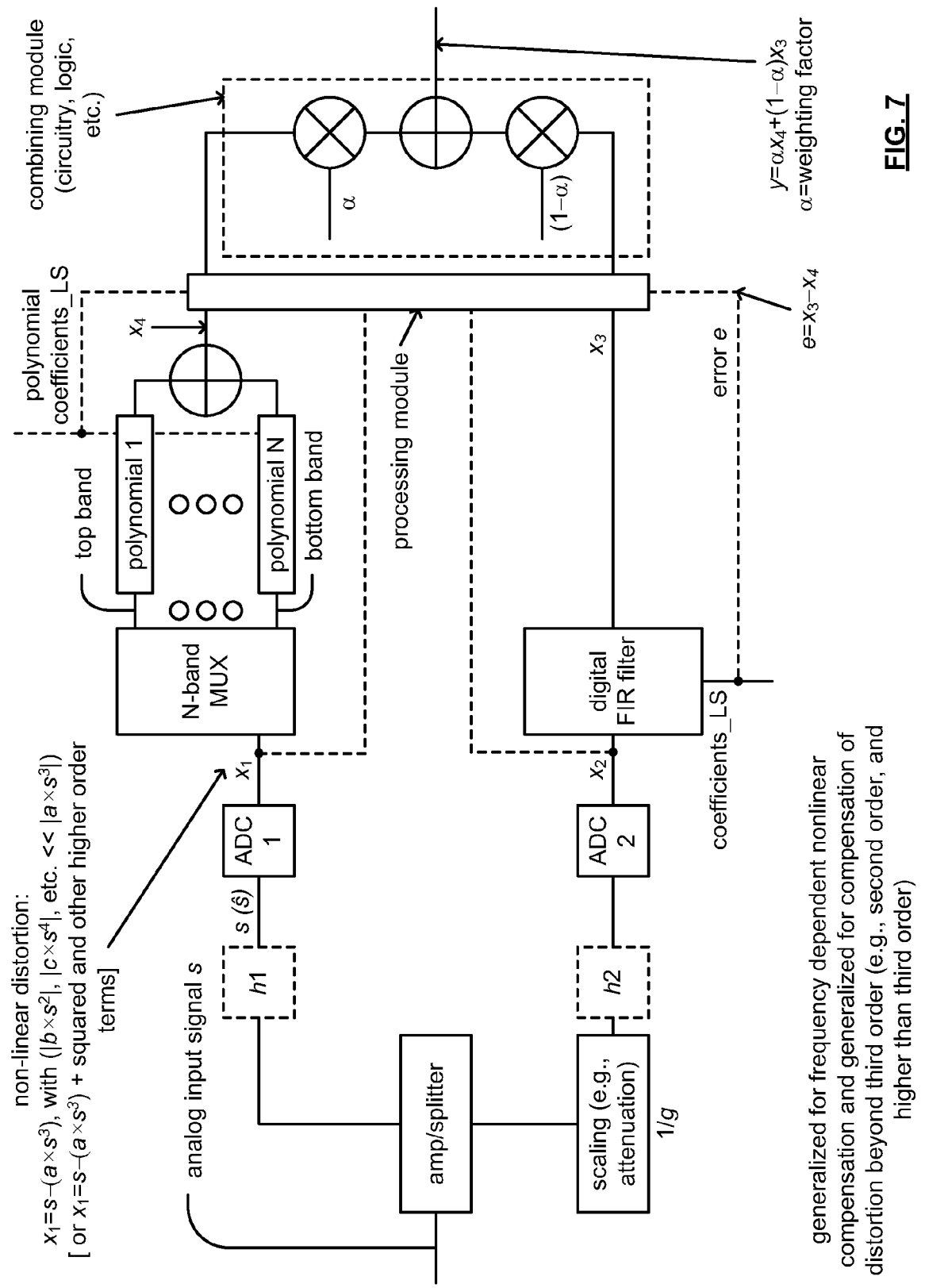
FIG. 7 illustrates an embodiment operative for adaptively calibrating frequency-selective imbalance and distortion between at least two ADCs implemented for processing an analog signal, and particularly for compensating for second, third, and even higher order distortion in a non-attenuated path.

FIG. 7 illustrates an embodiment operative for adaptively calibrating frequency-selective imbalance and distortion between at least two ADCs implemented for processing an analog signal, and particularly for compensating for second, third, and even higher order distortion in a non-attenuated path. Again, as with other embodiments, this embodiment includes two different pathways along which a continuous time or analog input signal x are provided, one of which is scaled (e.g., attenuated) and the other of which is not.

In this embodiment, non-linear distortion is compensated for using an N-band multiplexor (MUX) (a multi-band MUX), from which the signals output there from each pass through a respective polynomial module (such that each polynomial module corresponding to one respective band of the N-band MUX), from which one or more signals are output from the polynomial modules and added together. The coefficients for the respective polynomials corresponding to a top band, a second band, and so on up to a polynomial N may be LS determined such as in accordance with a LS methodology (e.g., as performed within or by a processing module). All of the polynomial outputs are summed together thereby generating a signal, $x_4$.

In this diagram, the continuous time or analog input signal s is shown as being provided to the various pathways for digital sampling using respective ADCs. The non-linear distortion in this embodiment may again be characterized as follows:

$$x_1=s-\alpha s^3.$$

Of course, again, more complex models may include additional terms (e.g., squared and higher order terms) with respect to modeling the non-linear distortion therein.

A FIR filter f1 (equalizer) is employed in the bottom pathway, after the ADC2, for performing gain compensation, whose coefficients are LS determined such as may be calculated by the processing module, thereby generating a signal, $x_3$.

After undergoing appropriate combining such as within a combining module, a composite signal, y, is output without having distortion and imbalance corresponding to or associated with the two ADCs.

It is noted that that the N-band MUX and anti-distortion polynomials can alternatively be applied in the bottom pathway (including ADC2) as well as, or instead of, the top pathway (including ADC1). In an embodiment where anti-distortion polynomials are applied in both of the pathways (e.g., top and bottom ADC paths), then Least Squares equations may be employed as containing dependency for coefficients in the two ADC paths to avoid infinity of solutions. The N-band MUX may precede digital FIR Filters for each respective band, followed by anti-distortion polynomials for each respective band.

Alternatively, in an embodiment including somewhat less complexity, the N-band MUX may follow the digital FIR Filter if band-specific processing is applied for the bottom pathway (including ADC2).

One or more anti-distortion polynomials may be applied in the bottom pathway (including ADC2), but may be less desirable in some instances, due to more coarse quantization. However, non-linear distortion in the top pathway (including ADC1) may be better mitigated with the bottom pathway (including ADC2) anti-distortion polynomial in some embodiments nonetheless. If anti-distortion polynomials are provided in the bottom pathway (including ADC2) for mitigating the distortion associated with the top pathway (including ADC1), and the combining weight α is not ½, so that the two paths are not combined with equal weight, then the difference in the combining weighting may be accounted for in setting the polynomial coefficients.

Figure 8:
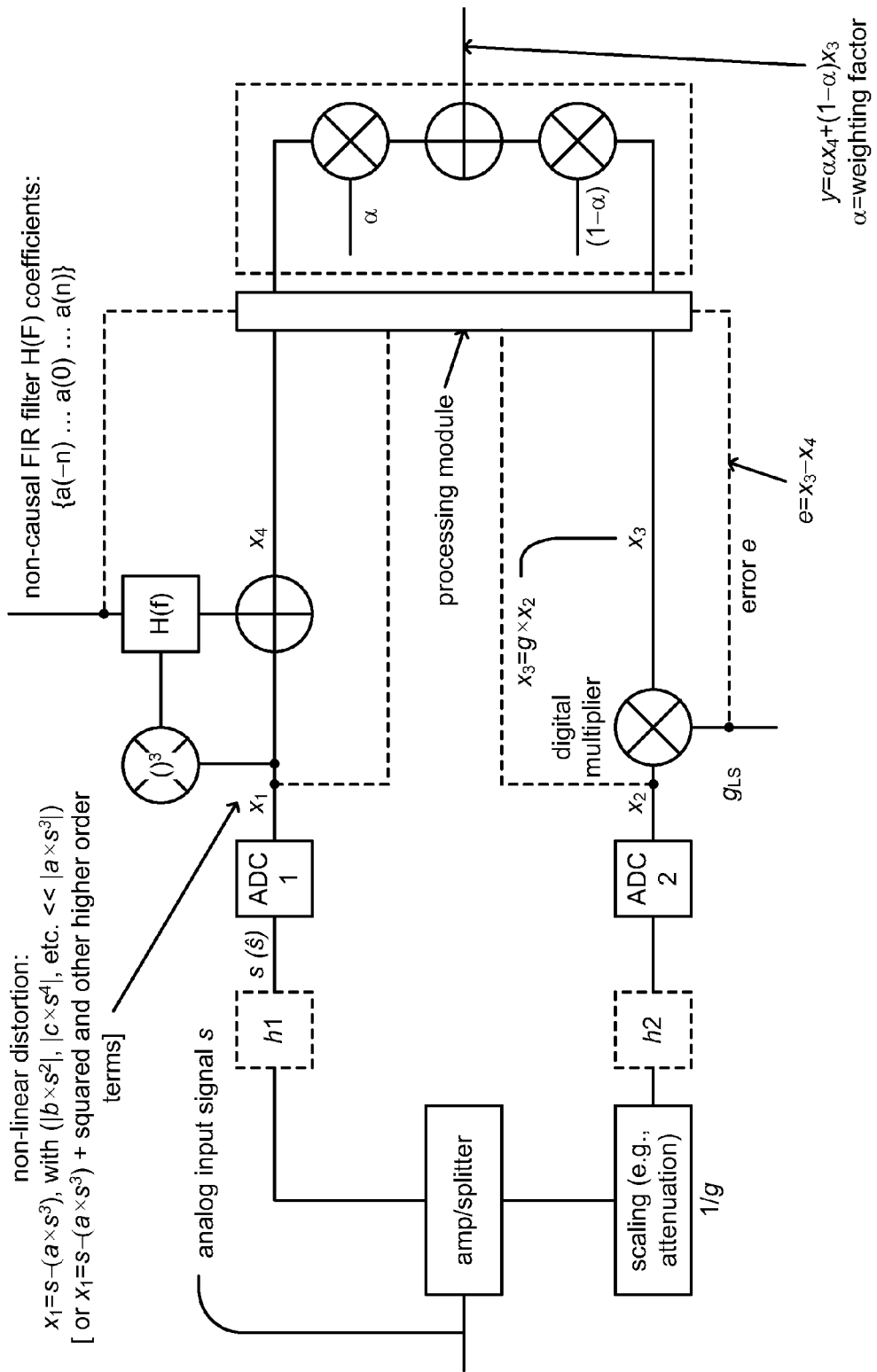
FIG. 8 illustrates an alternative embodiment operative for adaptively calibrating frequency-selective imbalance and distortion between at least two ADCs implemented for processing an analog signal, and particularly for compensating for third order distortion in a non-attenuated path.

FIG. 8 illustrates an alternative embodiment operative for adaptively calibrating frequency-selective imbalance and distortion between at least two ADCs implemented for processing an analog signal, and particularly for compensating for third order distortion in a non-attenuated path. Again, as with other embodiments, this embodiment includes two different pathways along which a continuous time or analog input signal x are provided, one of which is scaled (e.g., attenuated) and the other of which is not.

In this embodiment, non-linear distortion is compensated for using a cubic multiplier, a non-causal FIR filter, H(f), whose coefficients are determined using a LS methodology such as may be calculated by a processing module, and an adder. Again, in this diagram, the continuous time or analog input signal s is shown as being provided to the various pathways for digital sampling using respective ADCs. The non-linear distortion in this embodiment may be characterized as follows:

$$x_1 = s - \alpha s^3.$$

Of course, again, more complex models may include additional terms (e.g., squared and higher order terms) with respect to modeling the non-linear distortion therein.

A digital multiplier is employed in the bottom pathway, after the ADC2, for performing gain compensation, whose scaling factor/coefficient is governed by a LS determined coefficient ($g_{LS}$), as determined using a LS methodology such as may be calculated by the processing module.

As may be seen, any of a number of variations and combinations of compensation within the respective pathways within a multi-ADC or composite ADC (that includes multiple sub-ADCs) may be employed in alternative embodiments without departing from the scope and spirit of the invention. For example, any of a number of variations and alternative embodiments may be employed for performing compensation for the non-linear distortion within one of the pathways (e.g., the top pathway having the lesser attenuation). Analogously, any of a number of variations and alternative embodiments may be employed for performing compensation along the other of the pathways (e.g., the bottom pathway having the greater attenuation).

After undergoing appropriate combining such as within a combining module, a composite signal, y, is output without having distortion and imbalance corresponding to or associated with the two ADCs.

As may be seen, this diagram provides for imbalance and distortion cancellation for a composite ADC having $3^{rd}$ order non-linear distortion in the pathway having the lesser attenuation (e.g., the top pathway including ADC1). As may be seen when comparing this embodiment to the previous embodiment, a non-causal FIR filter, H(f), may be preferable over using one or more N-band multiplexers. Alternatively, causal filtering (as opposed to non-causal filtering) can be applied.

However, it is noted that non-causal filtering (e.g., wherein a flat phase response is possible) may be desirable and appropriate for certain embodiments, even if accompanied with a slight increase in complexity when compared to causal filtering (such as for compensating delays in other pathways).

Figure 9:
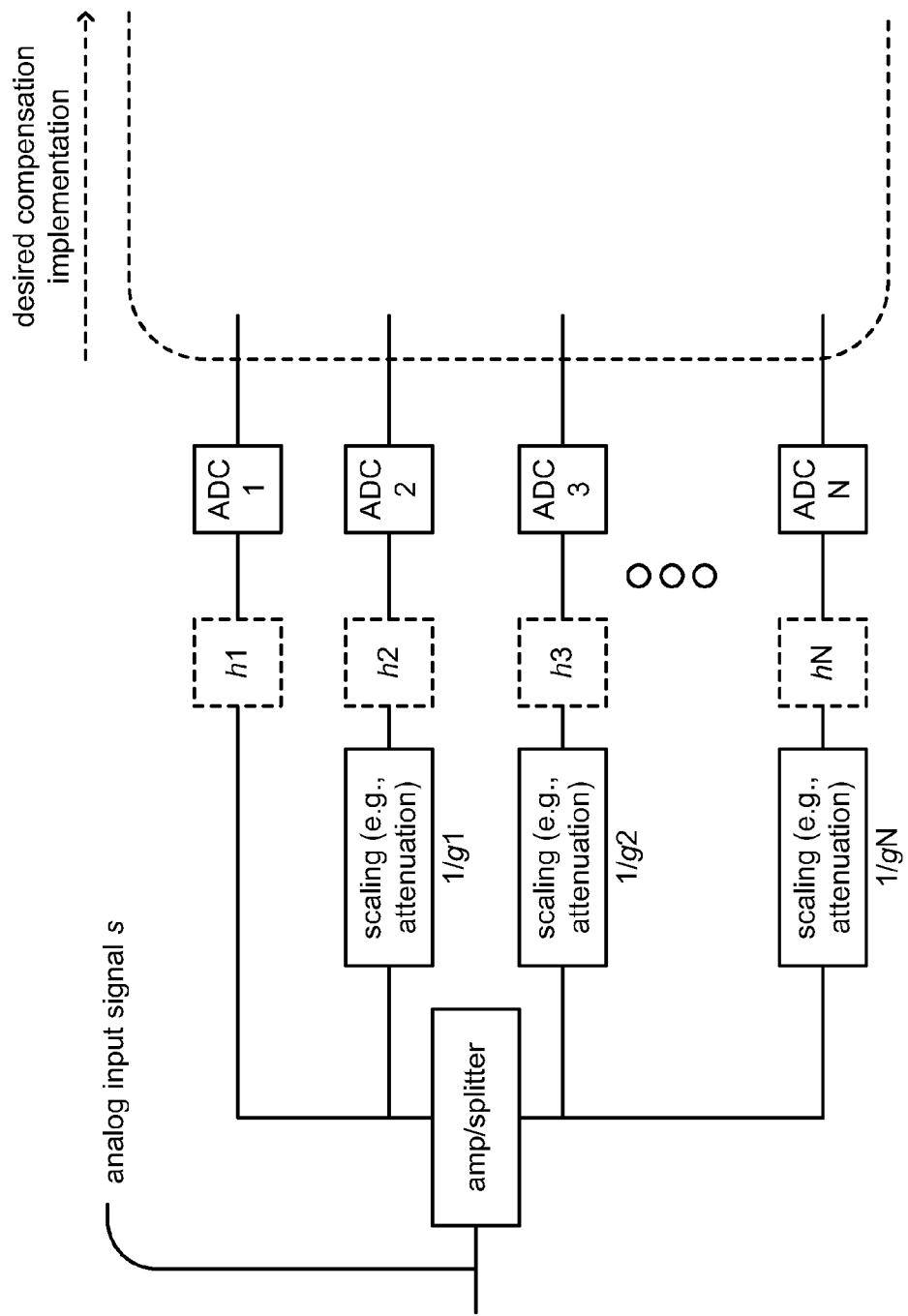
FIG. 9 illustrates an embodiment operative for employing adaptively calibrating frequency-selective imbalance and/or distortion between multiple ADCs shown respective via multiple, respective paths having selectable attenuation therein.

FIG. 9 illustrates an embodiment operative for employing adaptively calibrating frequency-selective imbalance and/or distortion between multiple ADCs shown respective via multiple, respective paths having selectable attenuation therein. It is also noted that certain embodiments may have more than two pathways and different means of compensation performed along such pathways.

As can be seen, a continuous time or analog input signal s may be provided generally to N different pathways. Each respective pathway may undergo a different amount of scaling. For example, a first pathway may undergo no attenuation (or simply have attenuation in accordance with a first value), a second pathway may have attenuation in accordance with a second value, a third pathway may have attenuation in accordance with a third value, and so on. Each respective signal, as generated by and output from each respective pathway, may undergo individual and respective compensation.

In embodiments within which multiple pathways are employed, such that each respective pathway performs digital sampling using a respective ADC therein, each respective pathway may perform digital sampling on respectively different, scaled versions of a continuous time or analog input signal s.

Again, any desired combination of compensation within the respective pathways may be performed in a given embodiment without departing from the scope and spirit of the invention.

Figure 10:
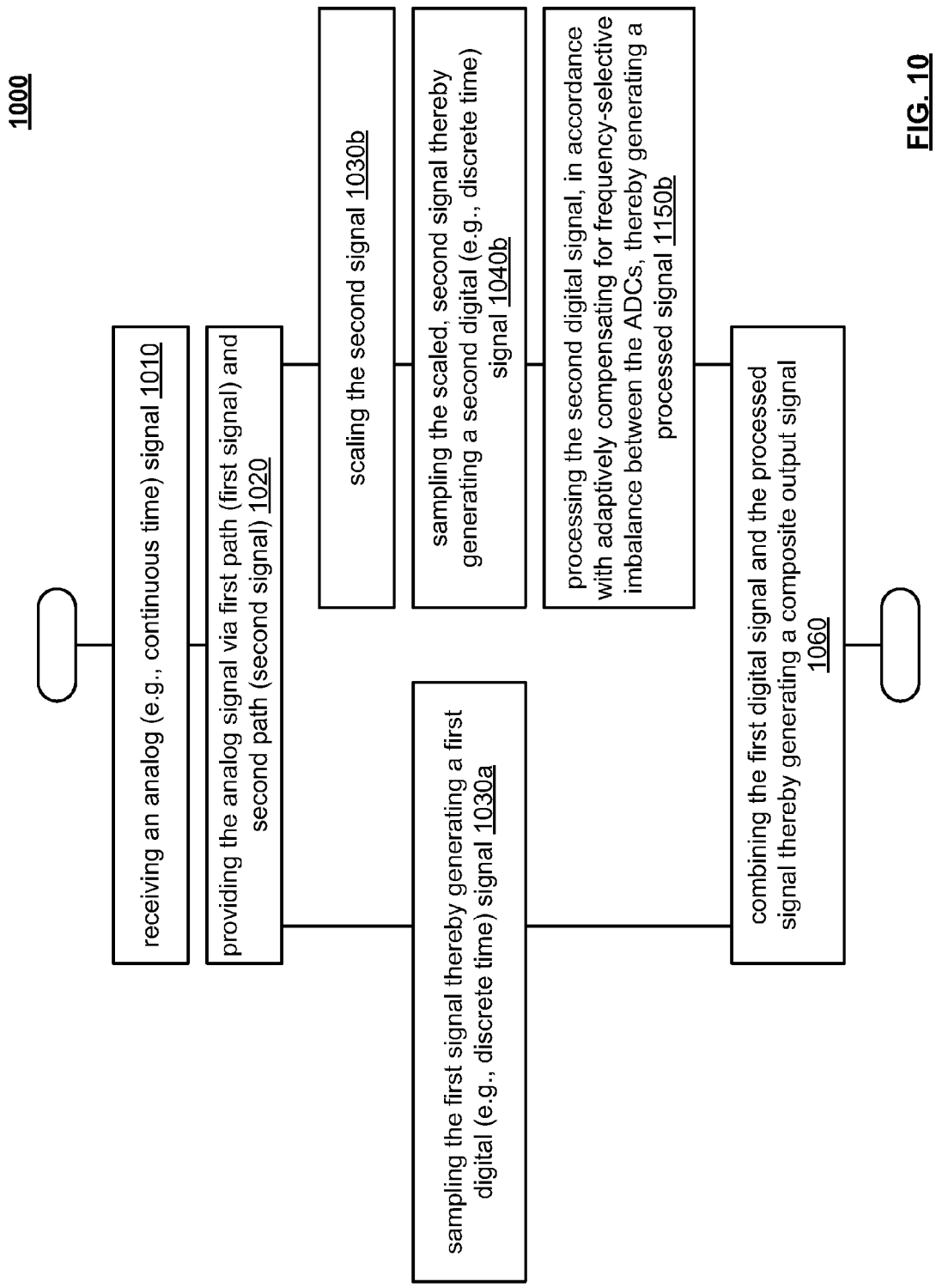
FIG. 10 illustrates an embodiment of a method for adaptively calibrating frequency-selective imbalance between at least two ADCs when processing an analog signal.

FIG. 10 illustrates an embodiment of a method for adaptively calibrating frequency-selective imbalance between at least two ADCs when processing an analog signal.

Referring to method 1000 of FIG. 10, the method 1000 begins by receiving an analog (e.g., continuous time) signal, as shown in a block 1010. The method 1000 continues by providing analog signal via first path (first signal) and second path (second signal), as shown in a block 1020. For example, this may involve providing the signal via multiple signal paths such as via an amplifier/splitter or some other means by which a signal may be providing via more than one path without loss of signal information, quality, etc.

The method 1000 may then operate by performing certain operations in parallel or simultaneously with respect to one another. For example, the method 1000 operates by sampling the first signal thereby generating a first digital (e.g., discrete time) signal, as shown in a block 1030*a*.

If desired, such simultaneous or parallel performed operations involve scaling the second signal, as shown in a block 1030*b*. This scaling may be attenuation in some embodiments. The method 1000 continues by sampling the scaled, second signal thereby generating a second digital (e.g., discrete time) signal, as shown in a block 1040*b*. The method then operates by processing the second, digital signal, in accordance with adaptively compensating for frequency-selective imbalance between the ADCs, thereby generating a processed signal, as shown in a block 1050*b*.

The method 1000 continues by combining the first digital signal and the processed signal thereby generating a composite output signal, as shown in a block 1060.

Figure 11:
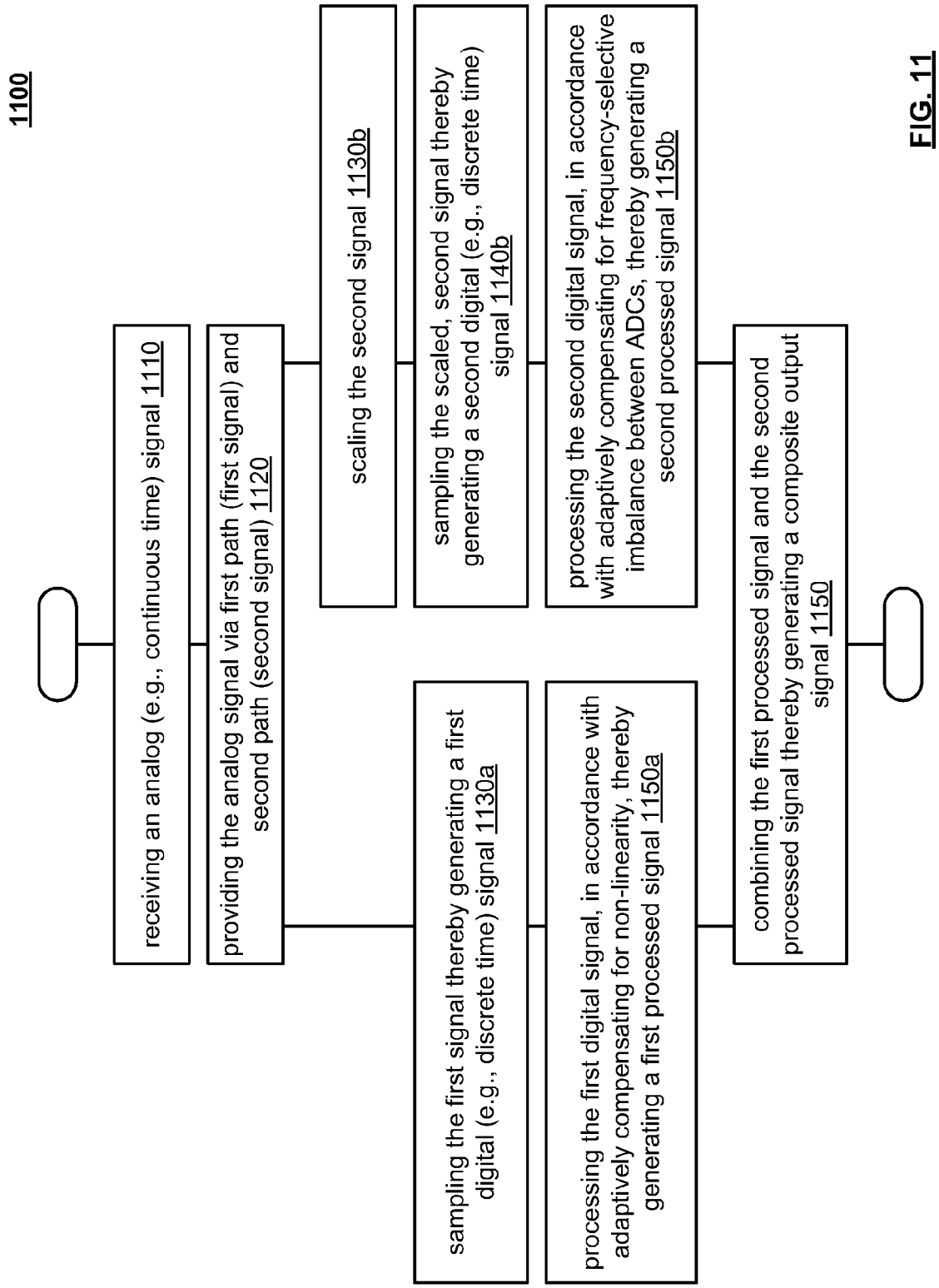
FIG. 11 illustrates an embodiment of a method for adaptively calibrating frequency-selective imbalance and distortion between at least two ADCs when processing an analog signal.

FIG. 11 illustrates an embodiment of a method for adaptively calibrating frequency-selective imbalance and distortion between at least two ADCs when processing an analog signal.

Referring to method 1100 of FIG. 11, the method 1100 begins by receiving an analog (e.g., continuous time) signal, as shown in a block 1110. The method 1100 continues by providing analog signal via first path (first signal) and second path (second signal), as shown in a block 1120. For example, this may involve providing the signal via multiple signal paths such as via an amplifier/splitter or some other means by which a signal may be providing via more than one path without loss of signal information, quality, etc.

As with respect to other embodiments, the method 1100 may then operate by performing certain operations in parallel or simultaneously with respect to one another. For example, the method 1100 then operates by sampling the first signal thereby generating a first digital (e.g., discrete time) signal, as shown in a block 1130*a*. The method 1100 then operates by processing the first digital signal, in accordance with adaptively compensating for non-linearity, thereby generating a first processed signal, as shown in a block 1150*a*. for example, certain If desired, such simultaneous operations involve scaling the second signal, as shown in a block 1130*b*. This scaling may be attenuation in some embodiments. The method 1100 continues by sampling the scaled, second signal thereby generating a second digital (e.g., discrete time) signal, as shown in a block 1140*b*. The method then operates by processing the second, digital signal, in accordance with adaptively compensating for frequency-selective imbalance between the ADCs, thereby generating a processed signal, as shown in a block 1150*b*.

The method 1100 continues by combining the first digital signal and the processed signal thereby generating a composite output signal, as shown in a block 1160.

It is noted that the various modules and/or circuitries (e.g., for encoding, decoding processing, scaling, filtering, adapting [such as for non-linearity], etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory (ROM), random access memory (RAM), volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

Terms such as "circuit", "circuitry", and/or their equivalents, etc. as used herein may refer to an independent circuit or to a portion of a multifunctional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may comprise general or specific purpose hardware, or may comprise such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences.

As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." That is to say, it is also noted that any of the connections or couplings between the various modules, circuits, functional blocks, components, devices, etc. within any of the various diagrams or as described herein may be differently implemented in different embodiments. For example, in one embodiment, such connections or couplings may be direct connections or direct couplings there between. In another embodiment, such connections or couplings may be indirect connections or indirect couplings there between (e.g., with one or more intervening components there between). Of course, certain other embodiments may have some combinations of such connections or couplings therein such that some of the connections or couplings are direct, while others are indirect. Different implementations may be employed for effectuating communicative coupling between modules, circuits, functional blocks, components, devices, etc. without departing from the scope and spirit of the invention.

As may even further be used herein, the term "operable to" and/or "operative to" indicates that an item includes one or more of power connections, input(s), output(s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a first analog to digital converter (ADC) for sampling a continuous time signal thereby generating a first digital signal;
a scaling module for scaling the continuous time signal thereby generating a scaled, continuous time signal;
a second ADC for sampling the scaled, continuous time signal thereby generating a second digital signal;
a compensation module for processing the second digital signal, based on a feedback signal, thereby generating a third digital signal; and
a processing module for:
generating the feedback signal in accordance with reducing an error between the first digital signal and the third digital signal; and
combining the first digital signal and the third digital signal thereby generating a fourth digital signal.

2. The apparatus of claim 1, further comprising:
an adaptive non-linearity module for processing the first digital signal thereby compensating for at least third order distortion therein; and wherein:
the processing module:
generating the feedback signal based on the first digital signal, after having undergone processing by the adaptive non-linearity module, and the third digital signal; and
combining the first digital signal, after having undergone processing by the adaptive non-linearity module, and the third digital signal thereby generating the fourth digital signal.

3. The apparatus of claim 2, wherein the adaptive non-linearity module including:
a non-causal finite impulse response (FIR) filter for processing a multiplied version of the first digital signal; and
a summer for adding an output from the non-causal finite impulse response (FIR) filter to the first digital signal thereby compensating for the at least third order distortion within the first digital signal.

4. The apparatus of claim 2, wherein the adaptive non-linearity module including:
a multi-band multiplexor (MUX) for processing the first digital signal;
a plurality of polynomial modules for respectively processing each of a plurality of output signals from the multi-band MUX using a plurality of polynomial coefficients generated by the processing module; and
a summer for adding each of a plurality of output signals from the plurality of polynomial modules thereby compensating for the at least third order distortion within the first digital signal.

5. The apparatus of claim 1, wherein the compensation module including a digital finite impulse response (FIR) filter or a digital multiplier.

6. The apparatus of claim 1, wherein:
the scaling module attenuating the continuous time signal thereby generating the scaled, continuous time signal.

7. The apparatus of claim 1, further comprising:
at least one additional scaling module for scaling the continuous time signal thereby generating at least one additional scaled, continuous time signal;
a third ADC for sampling the at least one additional scaled, continuous time signal thereby generating a fifth digital signal; and
at least one additional compensation module for processing the fifth digital signal, based on at least one additional feedback signal, thereby generating a sixth digital signal; and wherein:
the processing module:
generating the at least one additional feedback signal in accordance with reducing an error between the first digital signal, the third digital signal, and the sixth digital signal; and combining the first digital signal, the third digital signal, and the sixth digital signal thereby generating the fourth digital signal.

8. The apparatus of claim 7, wherein:
the scaling module attenuating the continuous time signal in accordance with a first attenuation factor thereby generating the scaled, continuous time signal; and
the at least one additional scaling module attenuating the continuous time signal in accordance with a second attenuation factor thereby generating the at least one additional scaled, continuous time signal.

9. The apparatus of claim 1, wherein:
the processing module combining the first digital signal and the third digital signal in accordance with a weighting factor thereby generating the fourth digital signal; and
the processing module setting the weighting factor based on whether or not at least one of the first ADC and the second ADC saturating or clipping during sampling.

10. The apparatus of claim 9, wherein:
the processing module setting the weighting factor at a first value when neither the first ADC nor the second ADC saturating or clipping during sampling;
the processing module setting the weighting factor at a second value when the second ADC being in a small amplitude region relative to the first ADC during sampling; and
the processing module setting the weighting factor at a third value when only the first ADC saturating or clipping during sampling.

11. The apparatus of claim 1, wherein:
the apparatus being a communication device; and
the communication device being operative within at least one of a satellite communication system, a wireless communication system, a wired communication system, and a fiber-optic communication system.

12. An apparatus, comprising:
a first analog to digital converter (ADC) for sampling a continuous time signal thereby generating a first digital signal;
an adaptive non-linearity module for processing the first digital signal, compensating for at least third order distortion therein, thereby generating a second digital signal;
a scaling module for attenuating the continuous time signal thereby generating a scaled, continuous time signal;
a second ADC for sampling the attenuated, continuous time signal thereby generating a third digital signal; and
a compensation module for processing the third digital signal, based on a feedback signal, thereby generating a fourth digital signal; and wherein:
the processing module:
generating the feedback signal in accordance with reducing an error between the second digital signal and the fourth digital signal; and
combining the second digital signal and the fourth digital signal thereby generating a fifth digital signal.

13. The apparatus of claim 12, wherein the adaptive non-linearity module including:
a non-causal finite impulse response (FIR) filter for processing a multiplied version of the first digital signal; and
a summer for adding an output from the non-causal finite impulse response (FIR) filter to the first digital signal thereby compensating for the at least third order distortion within the first digital signal and thereby generating the second digital signal.

14. The apparatus of claim 12, wherein the adaptive non-linearity module including:
a multi-band multiplexor (MUX) for processing the first digital signal;
a plurality of polynomial modules for respectively processing each of a plurality of output signals from the multi-band MUX using a plurality of polynomial coefficients generated by the processing module; and
a summer for adding each of a plurality of output signals from the plurality of polynomial modules thereby compensating for the at least third order distortion within the first digital signal and thereby generating the second digital signal.

15. The apparatus of claim 12, wherein the compensation module including a digital finite impulse response (FIR) filter or a digital multiplier.

16. The apparatus of claim 12, wherein:
the processing module combining the second digital signal and the fourth digital signal in accordance with a weighting factor thereby generating the fifth digital signal; and
the processing module setting the weighting factor based on whether or not at least one of the first ADC and the second ADC saturating or clipping during sampling.

17. The apparatus of claim 16, wherein:
the processing module setting the weighting factor at a first value when neither the first ADC nor the second ADC saturating or clipping during sampling;
the processing module setting the weighting factor at a second value when the second ADC being in a small amplitude region relative to the first ADC during sampling; and
the processing module setting the weighting factor at a third value when only the first ADC saturating or clipping during sampling.

18. The apparatus of claim 12, wherein:
the apparatus being a communication device; and
the communication device being operative within at least one of a satellite communication system, a wireless communication system, a wired communication system, and a fiber-optic communication system.

19. A method for operating a communication device, the method comprising:
operating a first analog to digital converter (ADC) for sampling a continuous time signal thereby generating a first digital signal;
scaling the continuous time signal thereby generating a scaled, continuous time signal;
operating a second ADC for sampling the scaled, continuous time signal thereby generating a second digital signal;
processing the second digital signal, based on a feedback signal, thereby generating a third digital signal;
generating the feedback signal in accordance with reducing an error between the first digital signal and the third digital signal; and
combining the first digital signal and the third digital signal thereby generating a fourth digital signal.

20. The method of claim 19, further comprising:
processing the first digital signal thereby compensating for at least third order distortion therein;
generating the feedback signal based on the first digital signal, after having undergone processing by the adaptive non-linearity module, and the third digital signal; and combining the first digital signal, after having undergone processing by the adaptive non-linearity module, and the third digital signal thereby generating the fourth digital signal.

21. The method of claim 19, further comprising:
attenuating the continuous time signal thereby generating the scaled, continuous time signal.

22. The method of claim 19, further comprising:
scaling the continuous time signal thereby generating at least one additional scaled, continuous time signal;
operating a third ADC for sampling the at least one additional scaled, continuous time signal thereby generating a fifth digital signal;
processing the fifth digital signal, based on at least one additional feedback signal, thereby generating a sixth digital signal;
generating the at least one additional feedback signal in accordance with reducing an error between the first digital signal, the third digital signal, and the sixth digital signal; and
combining the first digital signal, the third digital signal, and the sixth digital signal thereby generating the fourth digital signal.

23. The method of claim 22, further comprising:
attenuating the continuous time signal in accordance with a first attenuation factor thereby generating the scaled, continuous time signal; and
attenuating the continuous time signal in accordance with a second attenuation factor thereby generating the at least one additional scaled, continuous time signal.

24. The method of claim 19, further comprising:
combining the first digital signal and the third digital signal in accordance with a weighting factor thereby generating the fourth digital signal; and
setting the weighting factor based on whether or not at least one of the first ADC and the second ADC saturating or clipping during sampling.

25. The method of claim 24, further comprising:
setting the weighting factor at a first value when neither the first ADC nor the second ADC saturating or clipping during sampling;
setting the weighting factor at a second value when the second ADC being in a small amplitude region relative to the first ADC during sampling; and
setting the weighting factor at a third value when only the first ADC saturating or clipping during sampling.

26. The method of claim 19, wherein:
the communication device being operative within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

| | | |
|---|---|---|
| PATENT NO. | : 7,952,502 B2 | Page 1 of 1 |
| APPLICATION NO. | : 12/949752 | |
| DATED | : May 31, 2011 | |
| INVENTOR(S) | : Thomas J. Kolze et al. | |

It is certified that error appears in the above-identified patent and that said Letters Patent is hereby corrected as shown below:

Title page, Item [74]: replace "Shayane X. Short" with --Shayne X. Short--

Signed and Sealed this
Twenty-ninth Day of January, 2013

David J. Kappos
*Director of the United States Patent and Trademark Office*